(12) United States Patent
Kim et al.

(10) Patent No.: US 9,113,563 B2
(45) Date of Patent: Aug. 18, 2015

(54) FLEXIBLE PRINTED CIRCUIT FILM AND DISPLAY DEVICE USING THE SAME

(71) Applicant: LG Display Co., Ltd., Seoul (KR)

(72) Inventors: Dae Il Kim, Gyeongbuk (KR); Yong Cheol Han, Gyeongbuk (KR); Dong Woo Kwon, Gyeonggi-do (KR); Tae Woo Kim, Ulsan (KR)

(73) Assignee: LG Display Co., Ltd., Seoul (KR)

( * ) Notice: Subject to any disclaimer, the term of this patent is extended or adjusted under 35 U.S.C. 154(b) by 449 days.

(21) Appl. No.: 13/727,044

(22) Filed: Dec. 26, 2012

(65) Prior Publication Data

US 2014/0043577 A1 Feb. 13, 2014

(30) Foreign Application Priority Data

Aug. 10, 2012 (KR) .......................... 10-2012-0087876

(51) Int. Cl.
| | |
|---|---|
| *G02F 1/133* | (2006.01) |
| *H05K 1/11* | (2006.01) |
| *H05K 1/02* | (2006.01) |
| *G02F 1/1333* | (2006.01) |
| *G02F 1/1345* | (2006.01) |
| *H05K 1/18* | (2006.01) |
| *H05K 1/14* | (2006.01) |

(52) U.S. Cl.
CPC ............ *H05K 1/11* (2013.01); *G02F 1/133305* (2013.01); *H05K 1/028* (2013.01); *H05K 1/118* (2013.01); *G02F 1/13452* (2013.01); *H05K 1/0228* (2013.01); *H05K 1/0281* (2013.01); *H05K 1/147* (2013.01); *H05K 1/189* (2013.01); *H05K 2201/053* (2013.01); *H05K 2201/09709* (2013.01); *H05K 2201/10136* (2013.01)

(58) Field of Classification Search
CPC . G02F 1/133005; G02F 1/13452; H05K 1/11; H05K 1/028; H05K 1/119
USPC ........................................................ 349/150
See application file for complete search history.

(56) References Cited

U.S. PATENT DOCUMENTS

| | | | |
|---|---|---|---|
| 7,183,660 B2 * | 2/2007 | Lee et al. ........................ | 257/786 |
| 2002/0033532 A1 * | 3/2002 | Wu et al. ........................ | 257/737 |
| 2007/0089900 A1 * | 4/2007 | Mitamura et al. ............. | 174/254 |
| 2011/0279765 A1 * | 11/2011 | Oohira .......................... | 349/150 |

* cited by examiner

*Primary Examiner* — James Dudek
(74) *Attorney, Agent, or Firm* — Morgan, Lewis & Bockius LLP

(57) ABSTRACT

Disclosed is a flexible printed circuit film (FPC film) and display device using the same, the FPC film comprising a body extending along a side of a substrate; and a connector protruding from the body and detachably combined with a PCB wherein the connector comprises: a flexible polymer film including pad region and line region, wherein a plurality of first via holes are formed in the pad region; a plurality of pads overlapped with the first via hole in the pad region on one surface of the flexible polymer film; and a plurality of lines electrically connected with the plurality of pads through the first via hole, wherein the plurality of pads are formed of pad sets of plural rows including a pad set of a first row and a pad set of a second row.

13 Claims, 14 Drawing Sheets

CRACK OCCURRENCE

FLEXIBLE PRINTED CIRCUIT FILM AND DISPLAY DEVICE USING THE SAME

CROSS REFERENCE TO RELATED APPLICATIONS

This application claims the benefit of the Korean Patent Application No. 10-2012-0087876 filed on Aug. 10, 2012, which is hereby incorporated by reference as if fully set forth herein.

BACKGROUND

1. Field of the Invention

The present invention relates to a display device, and more particularly, to a flexible printed circuit (FPC) film applied to the display device.

2. Discussion of the Related Art

Display devices for displaying images have been developed, for example, liquid crystal display (LCD) device, plasma display panel (PDP), organic light emitting display (OLED) device, and etc.

Hereinafter, a flexible printed circuit (FPC) film applied to a related art LCD device, one of the display devices, will be described as follows.

FIG. 1 illustrates the related art LCD device.

As shown in FIG. 1, the related art LCD device includes a liquid crystal panel 10, the FPC film 20, and a printed circuit board (PCB) 30.

The liquid crystal panel 10 includes an upper substrate 12 and a lower substrate 14. Although not shown, a liquid crystal layer is formed between the upper substrate 12 and the lower substrate 14. Herein, a size of the lower substrate 14 is larger than a size of the upper substrate 12, whereby some areas of an upper surface of the lower substrate 14 are exposed to the external, wherein a driving integrated circuit (driving IC) 16 is formed on the exposed area of the upper surface of the lower substrate 14. The driving IC 16 supplies a gate signal or a data signal to a gate line or a data line formed on the lower substrate 14.

The FPC film 20 is connected with the driving IC 16 and the PCB 30, whereby the FPC film 20 transmits a control signal from the PCB 30 to the driving IC 16. A base material of the FPC film 20 is a flexible polymer film so that the FPC film 20 is easily bent, and the control signal is transmitted through a micro line printed on the flexible polymer film.

Also, one side of the FPC film 20 is fixed to the lower substrate 14, and the other side of the FPC film 20 is detachably connected with the PCB 30. For the detachable connection with the PCB 30, a connector 25 is provided at the other side of the FPC film 20.

The PCB 30 is a circuit board obtained by printing a micro line on a predetermined board, wherein various devices are mounted on the PCB 30.

A mating connector 35 is provided at one side of the PCB 30. Thus, the mating connector 35 of the PCB 30 is combined with the connector 25 of the FPC film 20.

Hereinafter, a process for combining the mating connector 35 of the PCB 30 and the connector 25 of the FPC film 20 with each other will be described as follows.

FIG. 2 is a cross sectional view illustrating a process for combining the mating connector 35 of the PCB 30 and the connector 25 of the FPC film, which is a cross sectional view along A-A of FIG. 1.

As shown in FIG. 2, the connector 25 of the FPC film 20 is obtained by forming a pad layer 27 on a flexible polymer film 26. The connector 25 of the FPC film 20 is inserted into the inside of the mating connector 35 of the PCB 30, whereby the two connectors 25 and 35 are combined with each other.

However, the related art method has the following disadvantages.

During the process for inserting the connector 25 of the FPC film 20 into the inside of the connector 35 of the PCB 30, a worker bents the connector 25 of the FPC film 20 at a predetermined angle, whereby a crack occurs in a bent region of the pad layer 27 formed in the connector 25 of the FPC film 20. Similarly, a crack may occur in the pad layer 27 during the process for detaching the connector 25 of the FPC film 20 from the connector 35 of the PCB 30.

SUMMARY

Accordingly, the present invention is directed to an FPC film and a display device using the same that substantially obviates one or more problems due to limitations and disadvantages of the related art.

An aspect of the present invention is to provide an FPC film which enables to prevent crack occurrence in a bent region of a pad layer when a connector of FPC film is bent, and a display device using the FPC film.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided a flexible printed circuit film (FPC film) comprising: a body extending along a side of a substrate; and a connector protruding from the body, the connector detachably combined with a printed circuit board (PCB), wherein the connector comprises: a flexible polymer film including a pad region and a line region, wherein a plurality of first via holes are formed in the pad region; a plurality of pads overlapped with the first via hole in the pad region on one surface of the flexible polymer film; and a plurality of lines electrically connected with the plurality of pads through the first via hole, wherein the plurality of pads are formed of pad sets of plural rows including a pad set of a first row and a pad set of a second row.

In another aspect of the present invention, there is provided a display device comprising: a substrate on which gate and data lines are formed; a printed circuit board (PCB) on which a predetermined device is mounted; and a flexible printed circuit (FPC) film including a body extending along a side of a substrate, and a connector protruding from the body, wherein the connector is detachably combined with the PCB; wherein the connector comprises: a flexible polymer film including a pad region and a line region, wherein a plurality of first via holes are formed in the pad region; a plurality of pads overlapped with the first via hole in the pad region on one surface of the flexible polymer film; and a plurality of lines electrically connected with the plurality of pads through the first via hole, wherein the plurality of pads are formed of pad sets of plural rows including a pad set of a first row and a pad set of a second row.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the exemplary embodiments of the present invention, examples of which are illustrated in the accompanying drawings. Wherever possible, the same reference numbers will be used throughout the drawings to refer to the same or like parts.

Figure 1:
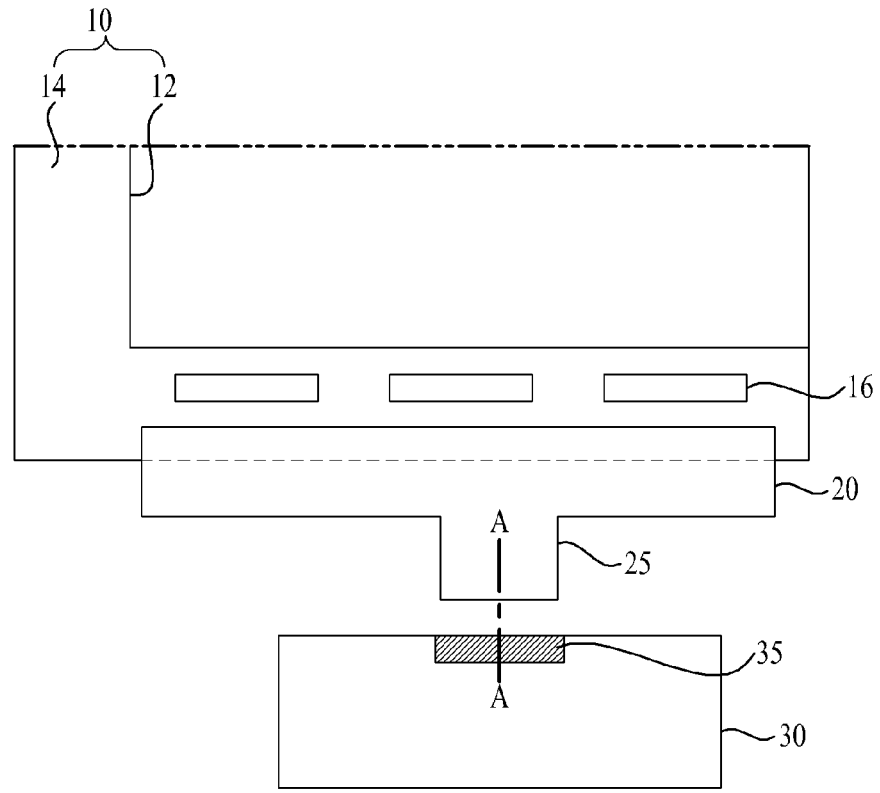
FIG. 1 illustrates a related art LCD device.
Figure 2:
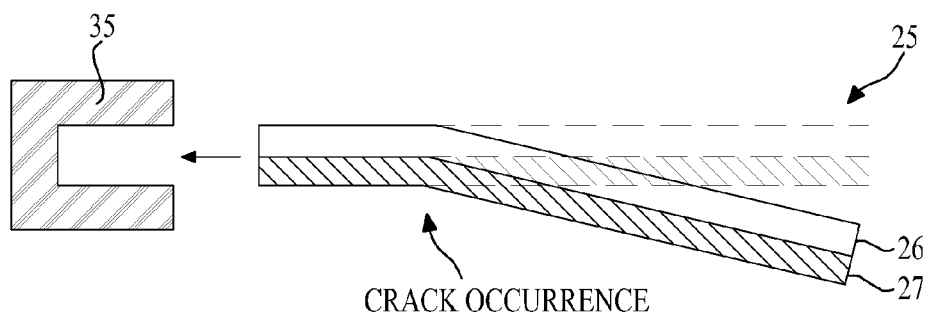
FIG. 2 is a cross sectional view illustrating a related art process for combining an FPC film and a PCB with each other.
Figure 3:
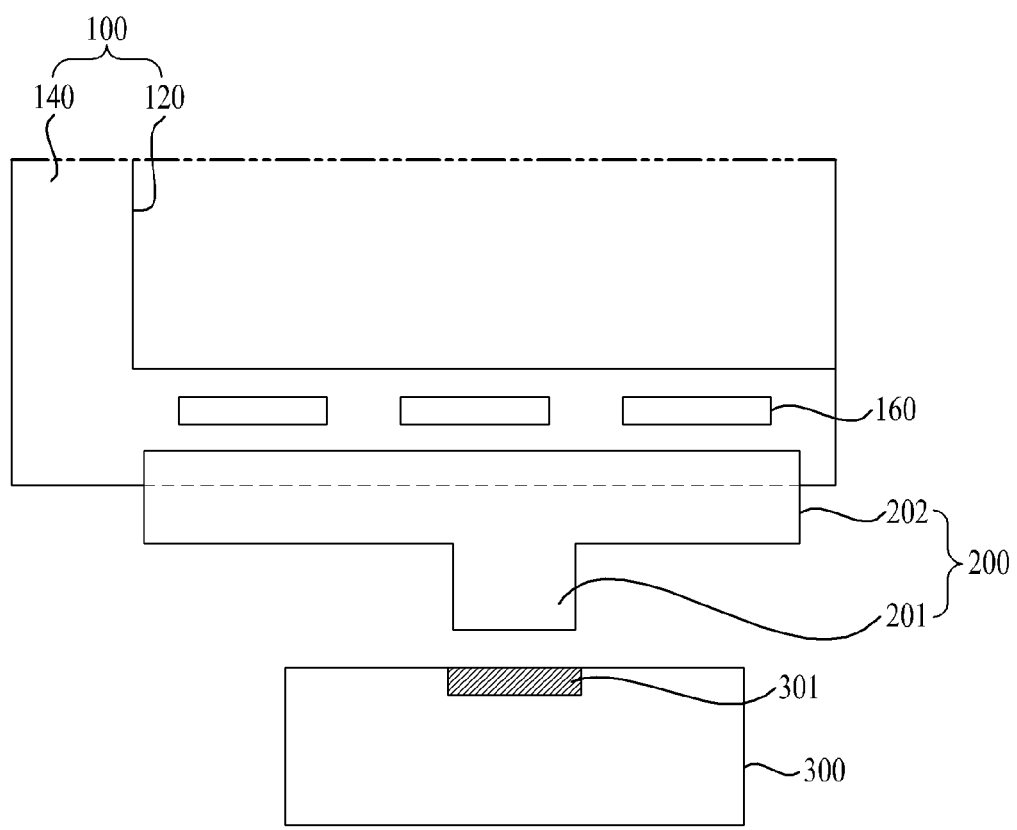
FIG. 3 illustrates an LCD device according to one embodiment of the present invention.

FIG. 3 illustrates an LCD device according to one embodiment of the present invention.

As shown in FIG. 3, the LCD device according to one embodiment of the present invention includes a liquid crystal panel 100, a flexible printed circuit film (FPC film) 200, and a printed circuit board (PCB) 300.

The liquid crystal panel 100 includes an upper substrate 120 and a lower substrate 140. Although not shown, a liquid crystal layer is formed between the upper substrate 120 and the lower substrate 140.

On the upper substrate 120, although not shown, there is a liquid shielding layer in a matrix configuration, wherein the light shielding layer prevents light from leaking in remaining regions except a pixel region. For a color realization, red, green and blue color filter layers may be respectively formed between each of the light shielding layer. Then, a common electrode may be formed on the color filter layer.

On the lower substrate 140, although not shown, there are gate and data lines, a thin film transistor, and a pixel electrode. The gate and data lines crossing each other defines the pixel region. Also, the thin film transistor functioning as a switching element is formed at a crossing portion of the gate and data lines. The pixel electrode is formed in the pixel region, wherein the pixel electrode is connected with the thin film transistor.

In case of In-Plane Switching (IPS) mode or Fringe Field Switching (FFS) mode, the common electrode is formed on the lower substrate 140 instead of the upper substrate 120. The present invention may include various types of LCD devices generally known to those in the art, for example, Twisted Nematic (TN) mode, Vertical Alignment (VA) mode, In-Plane Switching (IPS) mode, Fringe Field Switching (FFS) mode, and etc.

On the lower substrate 140, there is a driving integrated circuit (driving IC) 160. The driving IC 160 supplies a gate signal to the gate line on the lower substrate 140, or supplies a data signal to the data line on the lower substrate 140. The driving IC 160 is mounted on the lower substrate 140 of the liquid crystal panel 100, which is referred to as Chip-On-Glass (COG) type. However, the present invention is not limited to the COG type. If needed, the driving IC 160 may be mounted on the FPC film 200.

The FPC film 200 transmits a control signal from the PCB 300 to the driving IC 160. The FPC film 200 includes a body 202 extending along a side of the lower substrate 140, and a connector 201 protruding from the body 202.

The body 202 is fixed to the lower substrate 140, and the connector 201 is detachably combined with the PCB 300.

On the PCB 300, although not shown, there are devices such as DC-DC converter and timing controller mounted thereon. At one side of the PCB 300, there is a mating connector 301. The mating connector 301 of the PCB 300 is combined with the connector 201 of the FPC film 200. Especially, the mating connector 301 of the PCB 300 is provided with a plurality of pins, whereby the plurality of pins provided in the mating connector 301 of the PCB 300 are electrically connected with a plurality of pads provided in the connector 201 of the FPC film 200.

Hereinafter, the connector 201 of the FPC film 200 will be described in detail as follows.

Figure 4A:
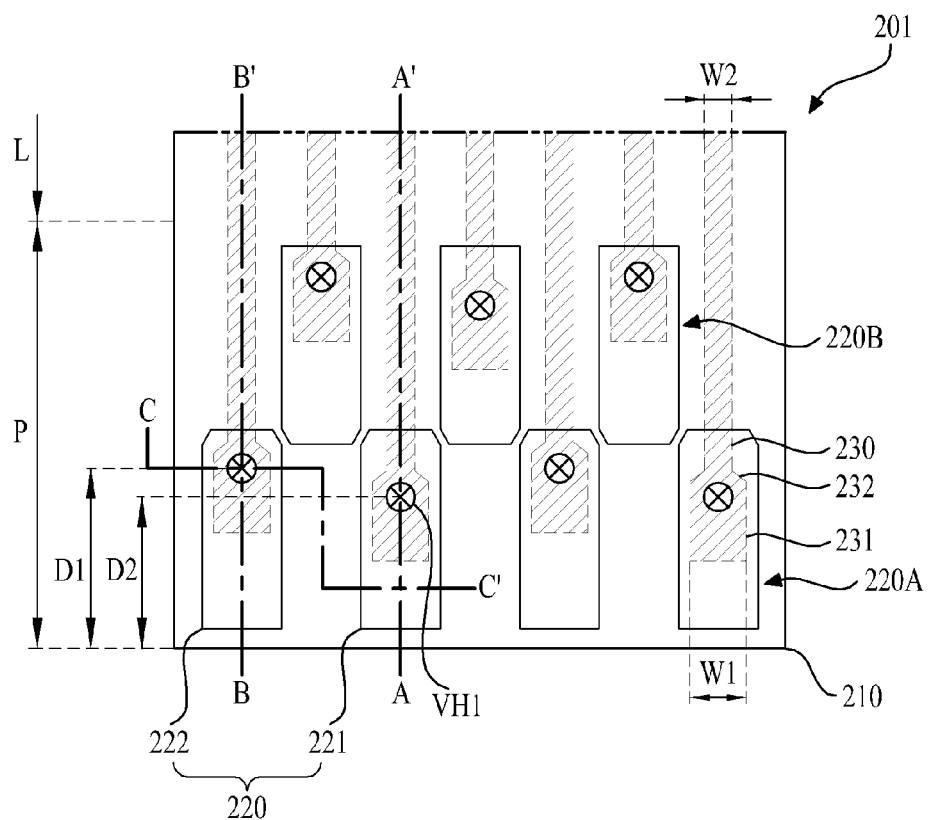
FIG. 4A is a plane view illustrating a connector provided in an FPC film according to one embodiment of the present invention.
Figure 4B:
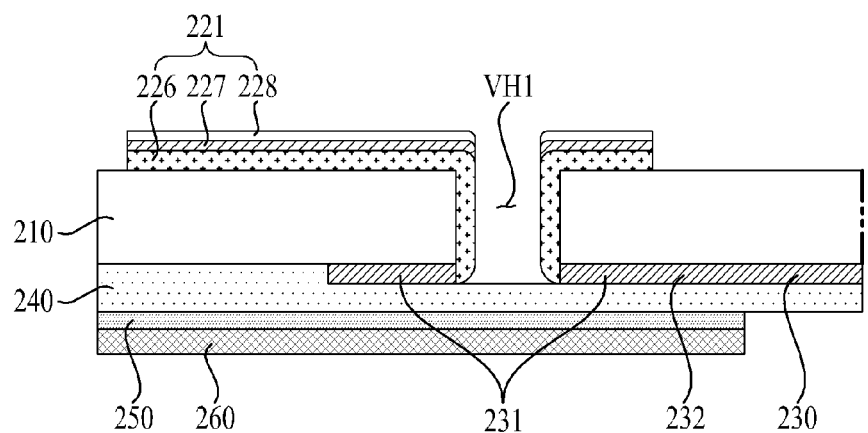
FIG. 4B is a cross sectional view along A-A of FIG. 4A, FIGS. 4C and 4D are cross sectional views along B-B of FIG. 4A.
Figure 4C:
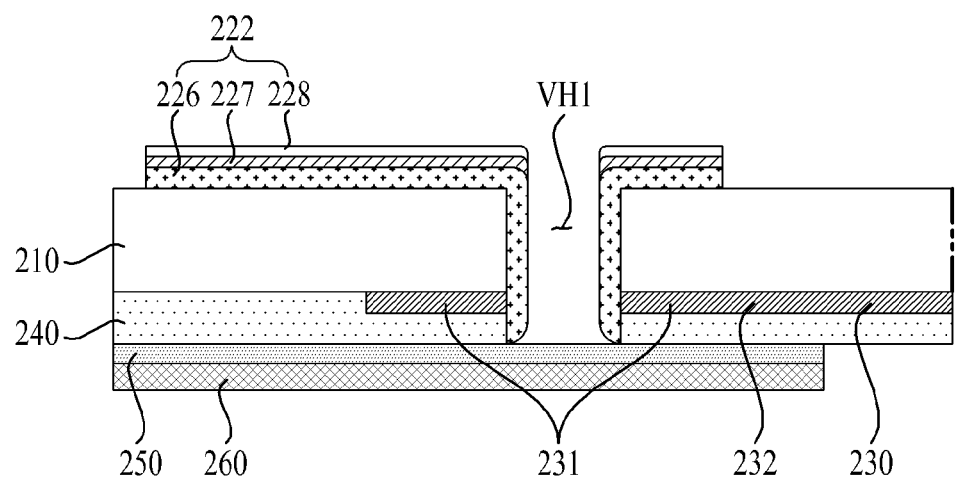
FIG. 4E is a cross sectional view along C-C' of FIG. 4A.
Figure 4D:
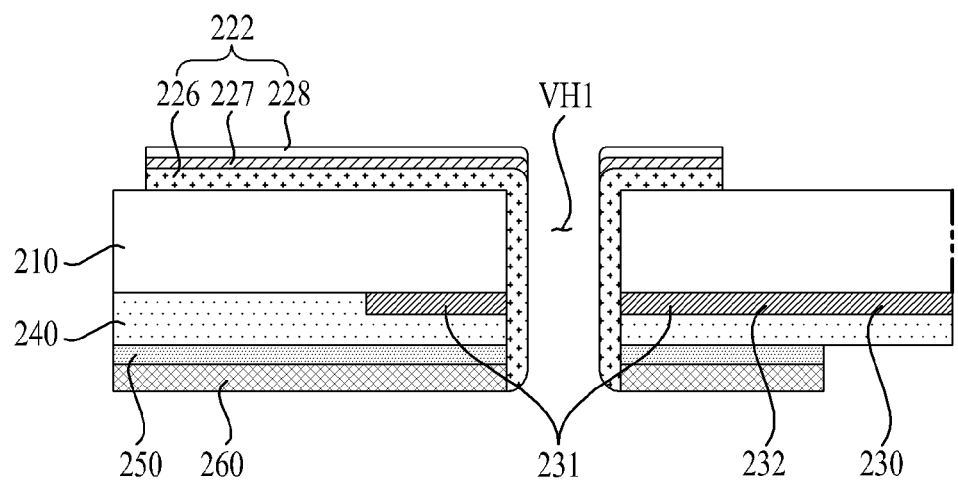
Figure 4E:
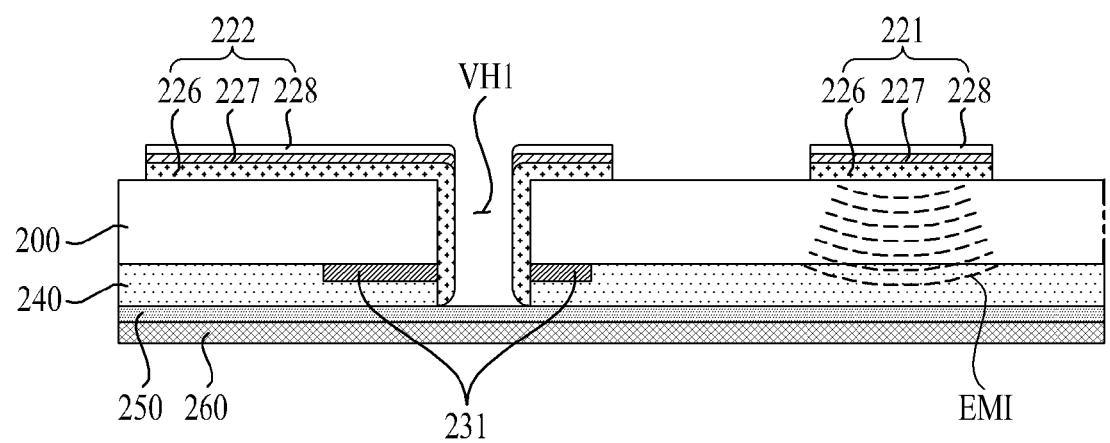

FIG. 4A is a plane view illustrating the connector of the FPC film according to one embodiment of the present invention. FIG. 4B is a cross sectional view along A-A of FIG. 4A. FIGS. 4C and 4D are cross sectional views along B-B of FIG. 4A. FIG. 4E is a cross sectional view along C-C' of FIG. 4A.

As shown in FIG. 4A, the connector 201 of the FPC film 200 includes a flexible polymer film 210, the plurality of pads 220, and a plurality of lines 230.

The flexible polymer film 210 includes a pad region (P) and a line region (L). The flexible polymer film 210 is formed of a flexible polymer material capable of being bent, wherein the flexible polymer material may be formed of various materials generally known to those in the art, for example, polyimide (PI).

The plurality of pads 220 are formed on one surface of the flexible polymer film 210. Especially, the plurality of pads 220 are exposed to the external in the pad region (P) positioned at an end of the connector 201.

The plurality of pads 220 may be formed of pad sets of plural rows. That is, the pad set 220A of the first row is formed at an end of the flexible polymer film 210, and the pad set 220B of the second row is formed at the upper region of the pad set 220A of the first row. Each of the pad set 220A of the first row and the pad set 220B of the second row is provided with a predetermined number of pads 220 arranged therein. The number of pads 220 for the pad set 220A of the first row may be different from the number of pads 220 for the pad set 220B of the second row. If needed, the number of pads 220 for the pad set 220A of the first row may be the same as the number of pads 220 for the pad set 220B of the second row. FIG. 4A illustrates only the pad set 220A of the first row and the pad set 220B of the second row. If needed, it is possible to additionally provide pad sets of three or more TOWS.

Each of the pads 220 may be formed in a rectangular structure whose upper two corners or lower two corners may be chamfered. In this case, it is possible to minimize the area of pad region (P) by decreasing an interval between the pad set 220A of the first row and the pad set 220B of the second row. That is, while the confronting corners of the pad set 220A of the first row and the pad set 220B of the second row are chamfered, the pads 220 for the pad set 220A of the first row and the pad set 220B of the second row are arranged in a zigzag pattern, to thereby minimize the area of the pad region (P).

The plurality of pads 220 may include a signal pad 221 and a ground pad 222. The signal pad 221 transmits the control signal from the aforementioned PCB (See '300' of FIG. 3) to the aforementioned driving IC (See '160' of FIG. 3). The ground pad 222 prevents EMI (Electro Magnetic Interference) which might occur during the process of transmitting the control signal.

The ground pad 222 may be formed at an end of the flexible polymer film 210, that is, one or two ground pads 222 may be formed in the pad set 220A of the first row, but not necessarily. If needed, it is possible to provide only the signal pad 221 without the ground pad 222. The ground pad 222 will be described in detail with reference to FIGS. 4C and 4D.

The plurality of lines (shown as dotted line) 230 are formed on the other surface of the flexible polymer film 210. Especially, the plurality of lines 230 extending from the line region (L) to the pad region (P) are electrically connected with the plurality of pads 220. In more detail, a first contact portion 231 is formed at an end in each of the lines 230, and the first contact portion 231 is connected with the pad 220. That is, the first contact portion 231 is formed in the pad region (P), and the line 230 extends from the pad region (P) to the line region (L).

In order to facilitate an electrical connection between the line 230 and the pad 220, a width (W1) of the first contact portion 231 is larger than a width (W2) of the line 230. In order to prevent a crack occurrence in the line 230, a first bottleneck portion 232 whose width is gradually decreased from 'W1' to 'W2' is formed between the first contact portion 231 and the line 230. That is, if forming only the first contact portion 231 and the line 230 without the first bottleneck portion 232, there is a high possibility of crack occurrence in the boundary between the first contact portion 231 and the line 230. According to one embodiment of the present invention, it is possible to prevent the crack by forming the first bottleneck portion 232 with the gradually-decreased width between the first contact portion 231 and the line 230.

Meanwhile, since the plurality of pads 220 are formed on one surface of the flexible polymer film 210 and the plurality of lines 230 are formed on the other surface of the flexible polymer film 210, a plurality of first via holes (VH1) are formed in the flexible polymer film 210 so as to electrically connect the pad 220 and the line 230 with each other. That is, the first via hole (VH1) is formed in the flexible polymer film 210, more particularly, in the predetermined portion being overlapped with the pad 220 and the first contact portion 231.

The plurality of first via holes (VH1) may include at least two of first via holes (VH1) provided at different positions inside the pad set 220A of the first row, and may include at least two of first via holes (VH1) provided at different positions inside the pad set 220B of the second row. For example, the odd-numbered first via hole (VH1) inside the pad set 220A of the first row is formed at a first distance D1 from the end of the flexible polymer film 210, and the even-numbered first via hole (VH1) inside the pad set 220A of the first row is formed at a second distance D2 (herein, the second distance D2 is shorter than the first distance D1) from the end of the flexible polymer film 210. In this case, the plurality of the first via holes (VH1) are distributedly positioned so that it is possible to prevent the crack from occurring in the pad 220.

The electrical connection between the pad 220 and the line 230 through the first via hole (VH1) will be easily understood with reference to FIGS. 4B to 4D.

FIG. 4B is a cross sectional view along A-A of FIG. 4A, which illustrates the electrical connection between the signal pad 221 and the line 230.

As shown in FIG. 4B, the first via hole (VH1) is formed in the predetermined portion of the flexible polymer film 210, and more particularly, the predetermined region overlapped with the signal pad 221 and the first contact portion 231. The first via hole (VH1) penetrates the flexible polymer film 210 from one surface of the flexible polymer film 210 to the other surface of the flexible polymer film 210.

The signal pad 221 is formed on one surface of the flexible polymer film 210. The signal pad 221 includes a metal layer 226, an interfacial layer 227 and an anticorrosive layer 228.

The metal layer 226 extends from one surface of the flexible polymer film 210 to the first contact portion 231 formed on the other surface of the flexible polymer film 210 along a sidewall of the first via hole (VH1). The metal layer 226 may be formed of copper (Cu), but not limited to the copper (Cu).

The interfacial layer 227 is formed between the metal layer 226 and the anticorrosive layer 228, to thereby enhance interfacial properties therebetween. For example, the interfacial layer 227 may be formed of nickel (Ni). The interfacial layer 227 may not be formed inside the first via hole (VH1), but not limited to this structure.

The anticorrosive layer 228 is formed on the interfacial layer 227, wherein the anticorrosive layer 228 prevents corrosion of the signal pad 221. For example, the anticorrosive layer 228 may be formed of aurum (Au). The anticorrosive layer 228 may not be formed inside the first via hole (VH1), but not limited to this structure.

Even though the interfacial properties are slightly lowered between the metal layer 226 and the anticorrosive layer 228, the interfacial layer 227 may not be formed so as to minimize the crack occurrence.

The signal pad 221 may be formed by a plating method.

On the other surface of the flexible polymer film 210, there are the first contact portion 231, the first bottleneck portion 232, and the line 230. The first contact portion 231 is connected with the signal pad 221 through the first via hole (VH1). Also, the first contact portion 231 is connected with the line 231 through the first bottleneck portion 232. Thus, the signal pad 221 is connected with the line 230 through the first contact portion 231 and the first bottleneck portion 232.

A first insulating layer 240 is formed on the first contact portion 231, the first bottleneck portion 232 and the line 230. The first insulating layer 240 enables to prevent the first contact portion 231, the first bottleneck portion 232 and the line 230 from being exposed to the external. Also, the first insulating layer 240 enables to prevent the crack from occurring in the first contact portion 231, the first bottleneck portion 232 and the line 230. The first insulating layer 240 may be formed in a film type. The first insulating layer 240 may be formed on the entire area of the other surface of the flexible polymer film 210 including the region of the first via hole (VH1). That is, in case of the region of the signal pad 221, the first insulating layer 240 may be formed on the entire area of the other surface of the flexible polymer film 210 after forming the first via hole (VH1).

An adhesive layer 250 is formed on the first insulating layer 240, and a reinforcement layer 260 is formed on the adhesive layer 250.

The adhesive layer 250 makes the reinforcement layer 260 adhere to the other surface of the flexible polymer film 210.

The adhesive layer 250 may be formed of thermosetting adhesive, and more particularly, epoxy-based adhesive or Nitrile Butadiene Rubber (NBR)-based adhesive. Meanwhile, as shown in FIGS. 4C to 4E, if the connector 201 is provided with the ground pad 222, the adhesive layer 250 includes a conductive material.

The reinforcement layer 260 facilitates insertion of the connector 201 of the FPC film 200 into the mating connector (See '301' of FIG. 3) of the PCB 300. That is, according to one embodiment of the present invention, the reinforcement layer 260 is formed on the other surface of the flexible polymer film 210, whereby it is possible to easily control a bending degree of the connector 201, that is, it is possible to handle the connector 201 with easiness. Thus, a worker appropriately bends the connector 201, and then inserts the appropriately-bent connector 201 into the mating connector (See '301' of FIG. 3) of the PCB 300.

The reinforcement layer 260 may be formed of a material with flexibility, for example, polyimide (PI). The reinforcement layer 260 formed in the pad region (See 'P' of FIG. 4A) may extend to the line region (See 'L' of FIG. 4A).

FIGS. 4C and 4D are cross sectional views along B-B of FIG. 4A, which illustrate the electrical connection between the ground pad 222 and the line 230. Hereinafter, a detailed explanation for only parts which are different from those of FIG. 4B will be described as follows.

As shown in FIGS. 4C and 4D, the first insulating layer 240 is not formed in the region of the first via hole (VH1), whereby the ground pad 222 is connected to the adhesive layer 250 as well as the first contact portion 231. In the region of the ground pad 222, the first via hole (VH1) is formed after the first insulating layer 240 is formed, whereby the first insulating layer 240 may be removed from the region of the first via hole (VH1).

As shown in FIG. 4C, since the adhesive layer 250 and the reinforcement layer 260 are formed after the first via hole (VH1) is formed, the adhesive layer 250 and the reinforcement layer 260 may be formed in the region of the first via hole (VH1). As shown in FIG. 4D, since the first via hole (VH1) is formed after the adhesive layer 250 and the reinforcement layer 260 is formed, the adhesive layer 250 and the reinforcement layer 260 may be removed from the region of the first via hole (VH1).

In case of FIG. 4C, the ground pad 222 may extend to the adhesive layer 250. In case of FIG. 4D, the ground pad 222 may extend to the reinforcement layer 260 along the sidewall inside the via hole (VH1).

Like the aforementioned signal pad 221, the ground pad 222 may include a metal layer 226, an interfacial layer 227 and an anticorrosive layer 228, wherein the ground pad 222 may be formed by a plating method. In more detail, the metal layer 226 of the ground pad 222 extending from one surface of the flexible polymer film 210 is formed along the sidewall of the first via hole (VH1) so that the metal layer 226 is connected with the first contact portion 231 formed on the other surface of the flexible polymer film 210. In addition, the metal layer 226 extends at least to the adhesive layer 250 by passing through the first contact portion 231 and the first insulating layer 240.

In this case, the adhesive layer 250 may include a conductive material. The adhesive layer 250 including the conductive material and the ground pad 222 enable to prevent electromagnetic interference (EMI), which will be described with reference to FIG. 4E.

As shown in FIG. 4E, when the control signal is transmitted through the signal pad 221, the electromagnetic interference (EMI) is generated adjacent to the signal pad 221. If the generated EMI remains without being completely discharged, an error may occur during the process for transmitting the control signal. Thus, according to one embodiment of the present invention, there is the adhesive layer 250 with the conductive properties, whereby the EMI generated adjacent to the signal pad 221 passes through the adhesive layer 250 with the conductive properties, and then the EMI is completely discharged through the ground pad 222.

Hereinafter, only peculiar structures for the following embodiments, which are different from those of the aforementioned FIGS. 4A to 4E, will be described in detail.

FIGS. 5A to 5E are plane views illustrating the connectors of the FPC films according to the various embodiments of the present invention.

Figure 5A:
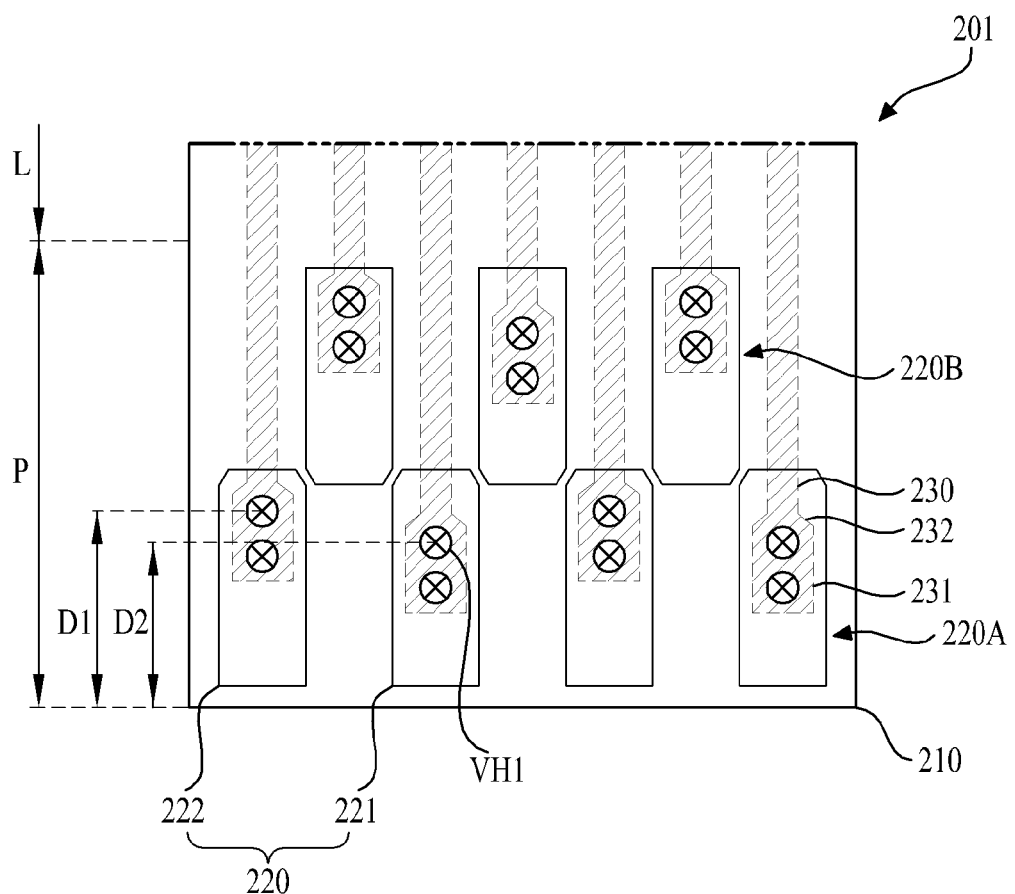
FIGS. 5A to 5E are plane views illustrating connectors provided in FPC films according to various embodiments of the present invention.

As shown in FIG. 5A, two of the first via holes (VH1) may be provided inside one pad 220, but not limited to this structure. For example, three of the first via holes (VH1) may be provided inside one pad 220.

Figure 5B:
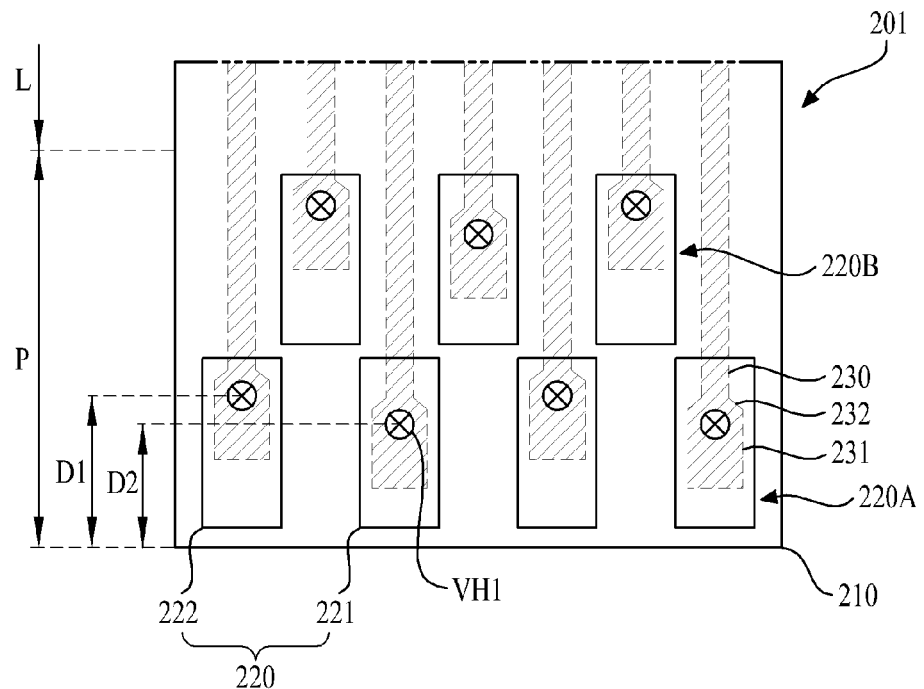
Figure 5C:
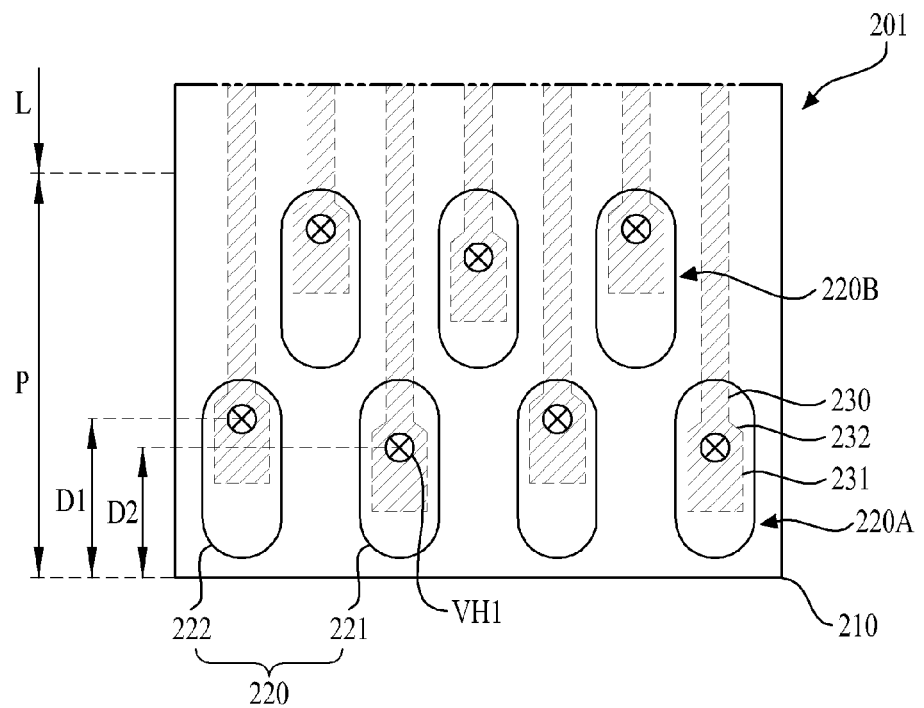
Figure 5D:
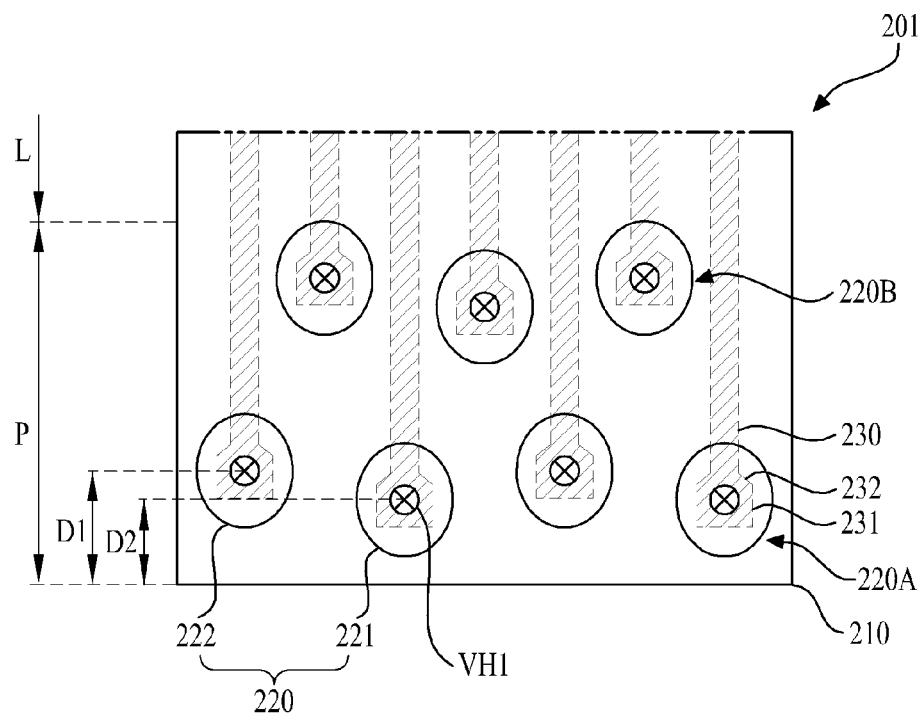
Figure 5E:
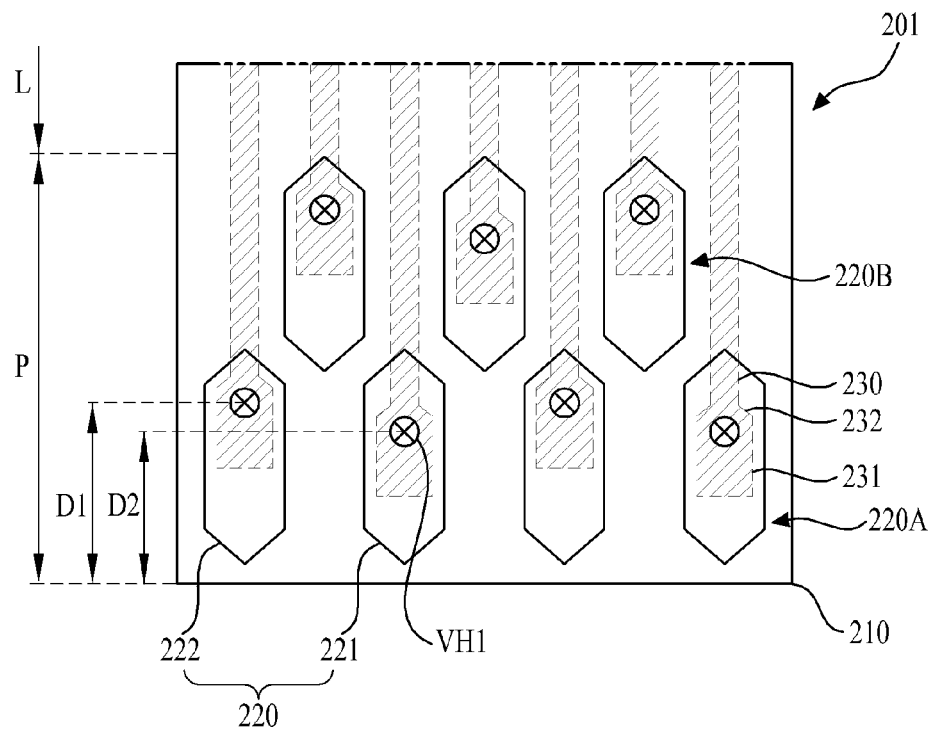

As shown in FIG. 5B, each of the pads 220 may be formed in a rectangular structure. As shown in FIG. 5C, each of the pads 220 may be formed in an elliptical structure. As shown in FIG. 5D, each of the pads 220 may be formed in a circle structure. As shown in FIG. 5E, each of the pads 220 may be formed in a hexagonal structure, to thereby obtain a honeycomb structure.

Figure 6:
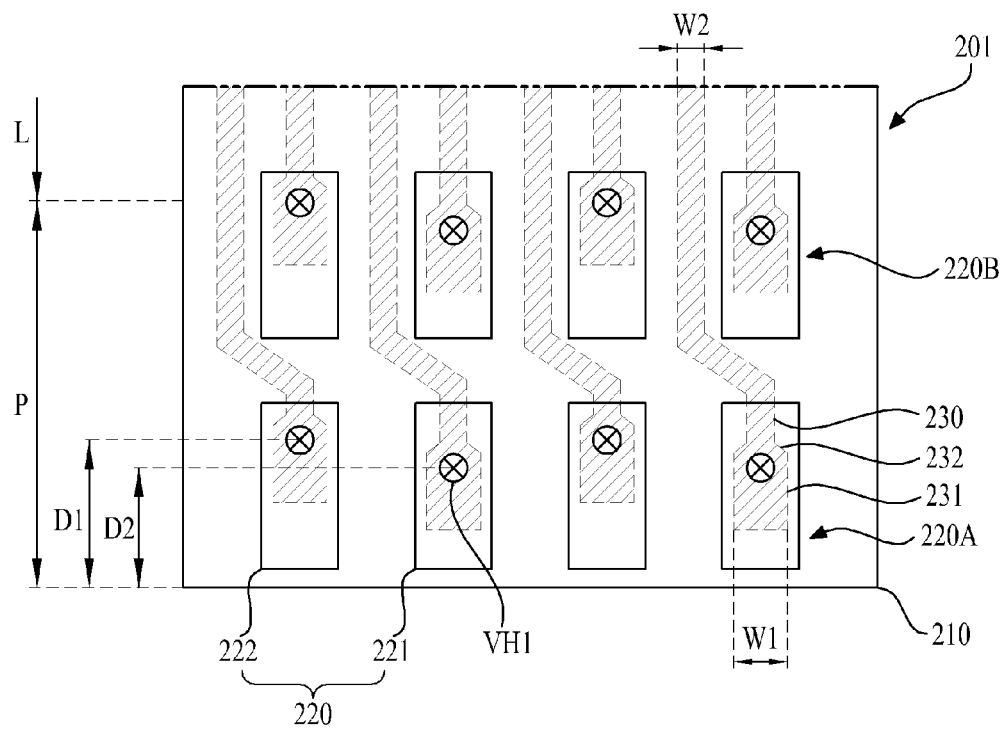
FIG. 6 is a plane view illustrating a connector provided in an FPC film according to another embodiment of the present invention.

FIG. 6 is a plane view illustrating a connector of an FPC film according to another embodiment of the present invention.

As shown in FIG. 6, a plurality of pads 220 are formed on one surface of a flexible polymer film 210. The plurality of pads 220 may be formed of pad sets of plural rows including a pad set 220A of a first row and a pad set 220B of a second row.

The pads 220 for the pad set 220A of the first row and the pad set 220B of the second row are provided in an in-line structure instead of a zigzag structure. That is, the pads 220 for the pad set 220A of the first row confront the pads 220 for the pad set 220B of the second row. Thus, the number of pads 220 for the pad set 220A of the first row is the same as the number of pads 220 for the pad set 220B of the second row.

A plurality of lines 230 are formed on the other surface of the flexible polymer film 210. Each of the lines 230 is connected with a first contact portion 231 through a first bottleneck portion 232. In this case, the first contact portion 231, the first bottleneck portion 232 and the line 230 may be arranged in an in-line shape, or may be arranged in a bent-line shape.

In more detail, if the first contact portion 231, the first bottleneck portion 232 and the line 230, which are electrically connected with the pads 220 for the pad set 220B of the second row, are arranged in the in-line shape; the first contact portion 231, the first bottleneck portion 232 and the line 230, which are electrically connected with the pads 220 for the pad set 220A of the first row, are arranged in the bent-line shape. On the contrary, if the first contact portion 231, the first bottleneck portion 232 and the line 230, which are electrically connected with the pads 220 for the pad set 220B of the second row, are arranged in the bent-line shape; the first contact portion 231, the first bottleneck portion 232 and the line 230, which are electrically connected with the pads 220 for the pad set 220A of the first row, are arranged in the in-line shape.

In the drawings, the first contact portion 231, the first bottleneck portion 232 and the line 230, which are electrically connected with the pads 220 for the pad set 220B of the second row, are arranged in the in-line shape; and the first contact portion 231, the first bottleneck portion 232 and the line 230, which are electrically connected with the pads 220 for the pad set 220A of the first row, are arranged in the bent-line shape, but not necessarily.

Figure 7A:
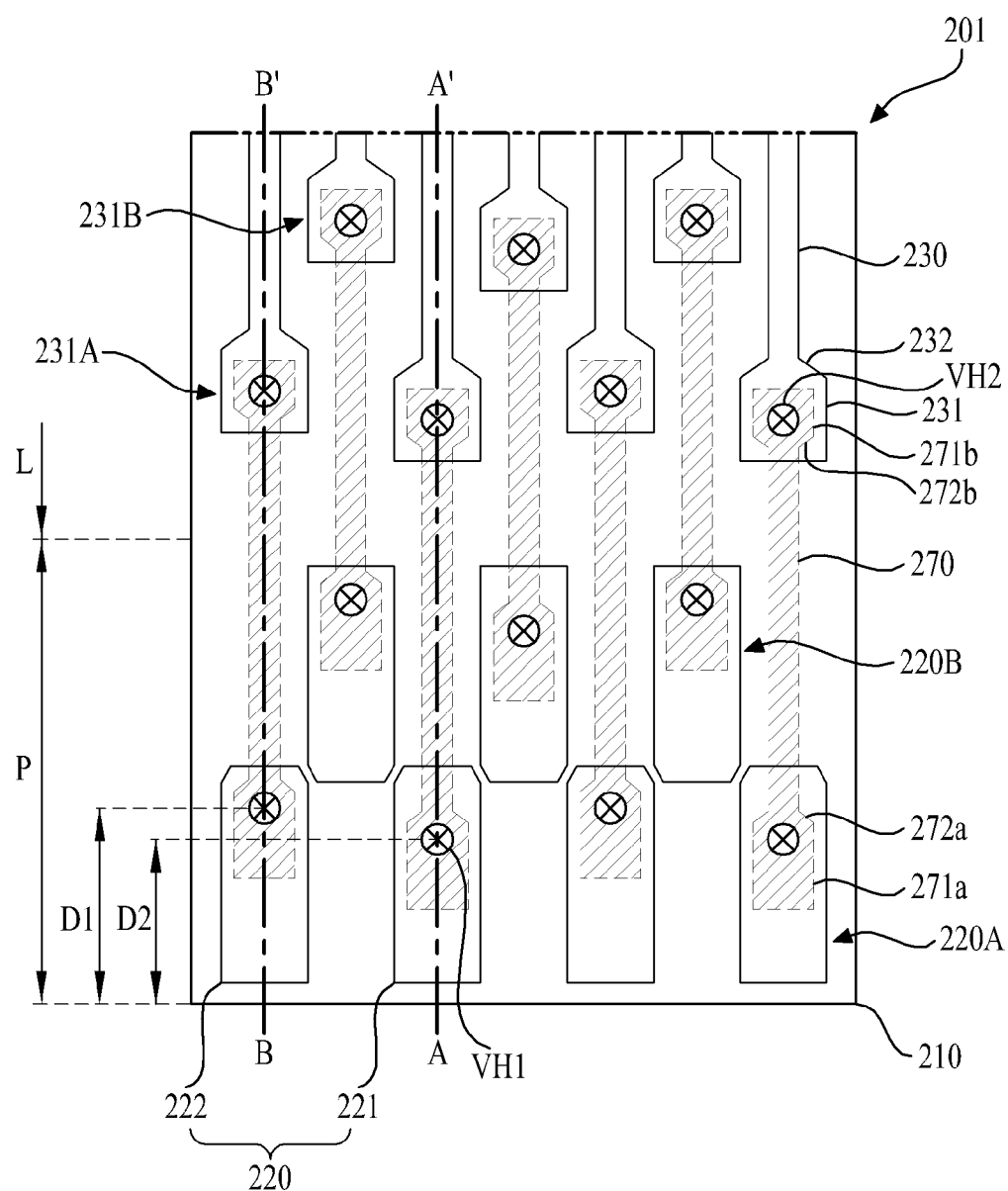
FIG. 7A is a plane view illustrating a connector provided in an FPC film according to another embodiment of the present invention.
Figure 7B:
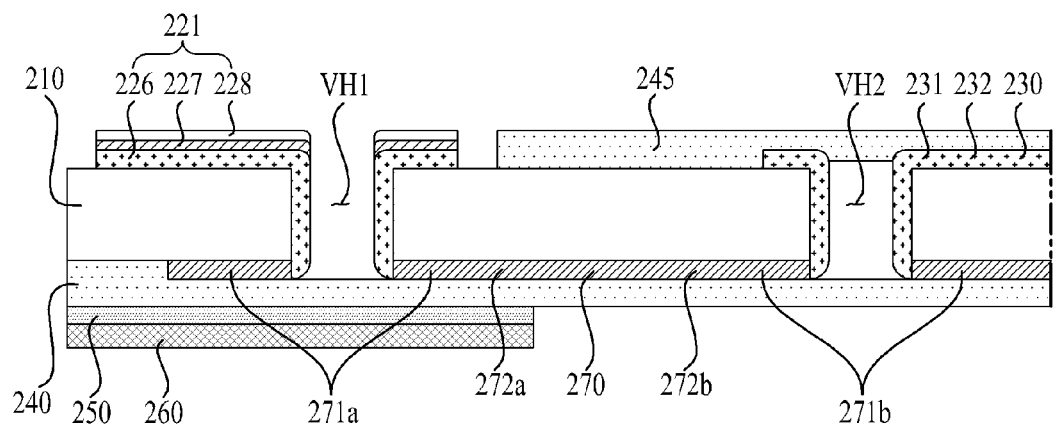
FIG. 7B is a cross sectional view along A-A of FIG. 7A, and FIGS. 7C and 7D are cross sectional views along B-B of FIG. 7A.
Figure 7C:
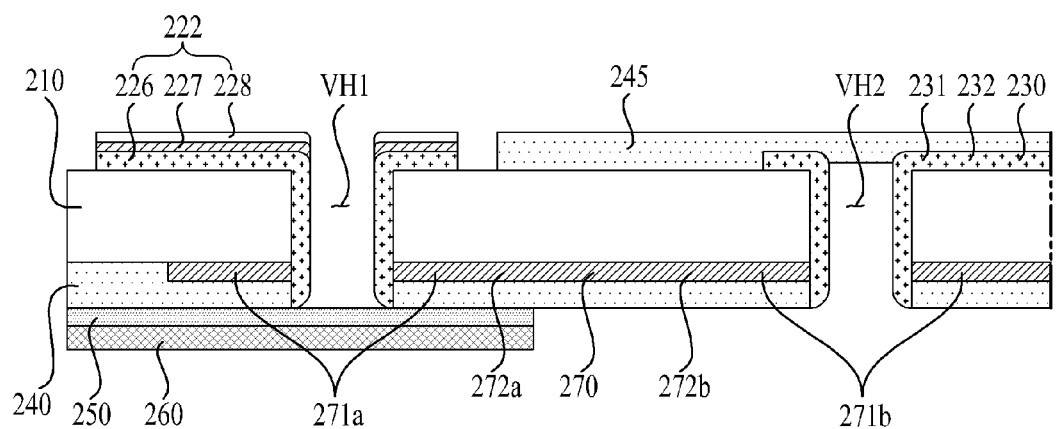
Figure 7D:
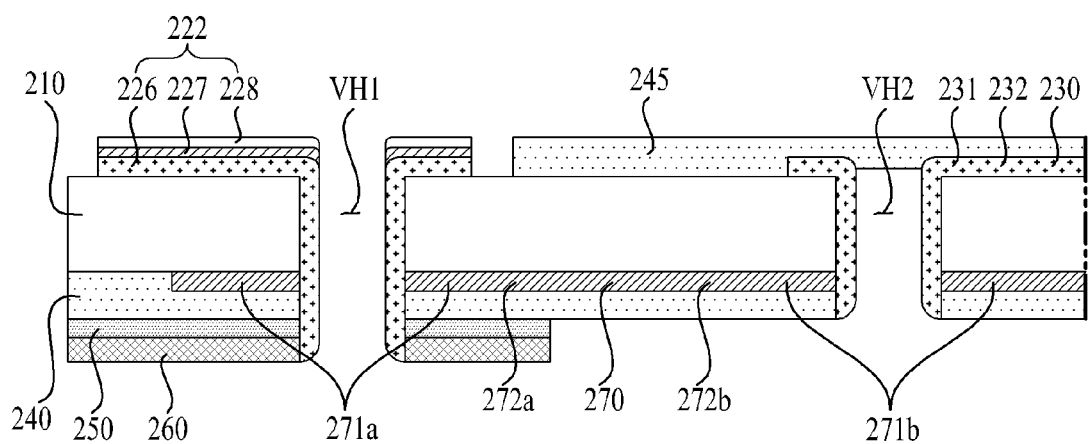

FIG. 7A is a plane view illustrating a connector of an FPC film according to another embodiment of the present invention. FIG. 7B is a cross sectional view along A-A of FIG. 7A. FIGS. 7C and 7D are cross sectional views along B-B of FIG. 7A.

As shown in FIG. 7A, a connector 201 of an FPC film includes a flexible polymer film 210, a plurality of pads 220, a plurality of lines 230, and a plurality of connection lines 270.

The plurality of pads 220 are formed in a pad region (P) on one surface of the flexible polymer film 210. The plurality of pads 220 may be formed of pad sets of plural rows including a pad set 220A of a first row and a pad set 220B of a second row.

The plurality of lines 230 are formed in a line region (L) on one surface of the flexible polymer film 210. Unlike the aforementioned embodiment, the plurality of lines 230 and the plurality of pads 220 are formed on the same surface of the flexible polymer film 210. Also, each of the lines 230 is connected with a first bottleneck portion 232 and a first contact portion 231. This combination of the line 230, the first bottleneck portion 232 and the first contact portion 231 is provided in the line region (L) without being extended to the pad region (P).

The plurality of first contact portions 231 may be formed of first contact portion sets of plural rows including a first contact portion set 231A of a first row and a second contact portion set 231B of a second row. The first contact portions 231 for the first contact portion set 231A of the first row and the first contact portions 231 for the first contact portion set 231B of the second row may be arranged in a zigzag pattern or in-line pattern.

The plurality of connection lines 270 (expressed as a dotted line) electrically connects the pad 220 and the line 230 with each other. The plurality of connection lines 270 are formed on the other surface of the flexible polymer film 210.

The connection line 270 formed on the other surface of the flexible polymer film 210 is electrically connected with the pad 220 and the line 230 formed on one surface of the flexible polymer film 210.

For this electrical connection, a second contact portion 271a is formed at one end of the connection line 270, and more particularly, the end of the connection line 270 overlapped with the pad 220. A width of the second contact portion 271a may be larger than a width of the connection line 270. Also, a second bottleneck portion 272a may be formed between the second contact portion 271a and the connection line 270, wherein a width of the second bottleneck portion 272a is gradually decreased.

Also, a third contact portion 271b is formed at the other end of the connection line 270, and more particularly, the end of the connection line 270 overlapped with the first contact portion 231. A width of the third contact portion 271b is larger than a width of the connection line 270. Also, a third bottleneck portion 272b is formed between the third contact portion 271b and the connection line 270, wherein a width of the third bottleneck portion 272b is gradually decreased.

Also, a plurality of first via holes (VH1) and a plurality of second via holes (VH2) are formed in the flexible polymer film 210.

The plurality of first via holes (VH1) may include at least two of first via holes (VH1) formed at different positions inside the pad set 220A of the first row, and at least two of first via holes (VH1) formed at different positions inside the pad set 220B of the second row, whereby the plurality of first via holes (VH1) are distributedly positioned.

The plurality of second via holes (VH2) may include at least two of second via holes (VH2) formed at different positions inside the first contact portion set 231A of the first row, and at least two of second via holes (VH2) formed at different positions inside the first contact portion set 231B of the second row, whereby the plurality of second via holes (VH2) are distributedly positioned.

Hereinafter, a cross sectional structure of the connector 201 provided in the FPC film will be described with reference to FIGS. 7B to 7D.

FIG. 7B is a cross sectional view along A-A of FIG. 7A, which illustrates the electrical connection between a signal pad 221 and the line 230.

As shown in FIG. 7B, the first via hole (VH1) and the second via hole (VH2) are formed in the flexible polymer film 210. The first via hole (VH1) is formed at an overlapping portion between the signal pad 221 and the second contact portion 271a, and the second via hole (VH2) is formed at an overlapping portion between the first contact portion 231 and the third contact portion 271b.

The first via hole (VH1) and the second via hole (VH2) penetrate the flexible polymer film 210 from one surface of the flexible polymer film 210 to the other surface of the flexible polymer film 210.

On the pad region (P) of one surface of the flexible polymer film 210, there is the signal pad 221. Like the aforementioned embodiment, the signal pad 221 may include a metal layer 226, an interfacial layer 227 and an anticorrosive layer 228. The metal layer 226 extending from one surface of the flexible polymer film 210 is formed along a sidewall of the first via hole (VH1) so that the metal layer 226 is connected with the second contact portion 271a formed on the other surface of the flexible polymer film 210.

Also, the first contact portion 231, the first bottleneck portion 232 and the line 230 are formed in the line region (L) on one surface of the flexible polymer film 210. The first contact portion 231 extending from one surface of the flexible polymer film 210 is formed along a sidewall of the second via hole (VH2), whereby the first contact portion 231 is electrically connected with the third contact portion 271b on the other surface of the flexible polymer film 210.

A second insulating layer 245 is formed on the first contact portion 231, the first bottleneck portion 232 and the line 230. Owing to the second insulating layer 245, the first contact portion 231, the first bottleneck portion 232 and the line 230 are not exposed to the external. The second insulating layer 245 is formed not in the pad region (P) but in the line region (L). Also, the second insulating layer 245 of a film type may be formed in the region of the second via hole (VH2).

On the other surface of the flexible polymer film 210, there are the second contact portion 271a, the second bottleneck portion 272a, the connection line 270, the third bottleneck portion 272b and the third contact portion 271b.

The second contact portion 271a is connected with the signal pad 221 through the first via hole (VH1), the third contact portion 271b is connected with the first contact portion 231 through the second via hole (VH2), and the second contact portion 271a is connected with the third contact portion 271b through the second bottleneck portion 272a, the connection line 270 and the third bottleneck portion 272b. Thus, the signal pad 221 is connected with the line 230 through the second contact portion 271a, the second bottleneck portion 272a, the connection line 270, the third bottleneck portion 272b, the third contact portion 271b, the first contact portion 231 and the first bottleneck portion 232.

A first insulating layer 240 is formed on the second contact portion 271a, the second bottleneck portion 272a, the connection line 270, the third bottleneck portion 272b and the third contact portion 271b. Owing to the first insulating layer 240, it is possible to prevent the second contact portion 271a, the second bottleneck portion 272a, the connection line 270, the third bottleneck portion 272b and the third contact portion 271b from being exposed to the external, and to prevent crack occurrence. The first insulating layer 240 is formed on the entire area of the other surface of the flexible polymer film 210 including the first via hole (VH1) and the second via hole (VH2).

An adhesive layer 250 is formed on the first insulating layer 240, and a reinforcement layer 260 is formed on the adhesive layer 250.

FIGS. 7C and 7D are cross sectional views along B-B of FIG. 7A, which illustrates the electrical connection between a ground pad 222 and the line 230.

As shown in FIGS. 7C and 7D, the first insulating layer 240 is not formed in the region of the first via hole (VH1), whereby the ground pad 222 is connect with the adhesive layer 250 as well as the first contact portion 231. In the region of the ground pad 222, the first via hole (VH1) is formed after the first insulating layer 240 is formed, whereby the first insulating layer 240 may be removed from the region of the first via hole (VH1).

Meanwhile, as shown in FIG. 7C, since the adhesive layer 250 and the reinforcement layer 260 are formed after the first via hole (VH1) is formed, the adhesive layer 250 and the reinforcement layer 260 may be formed in the region of the first via hole (VH1). However, in case of FIG. 7D, since the first via hole (VH1) is formed after the adhesive layer 250 and the reinforcement layer 260 are formed, the adhesive layer 250 and the reinforcement layer 260 may be removed from the region of the first via hole (VH1).

In case of FIG. 7C, the ground pad 222 extends to the adhesive layer 240. In case of FIG. 7D, the ground pad 222 may extend to the reinforcement layer 260 along the sidewall inside the first via hole (VH1).

Like the aforementioned embodiment, the ground pad 222 may include a metal layer 226, an interfacial layer 227 and an anticorrosive layer 228, which may be formed by a plating method. In more detail, the metal layer 226 of the ground pad 222 extending from one surface of the flexible polymer film 210 are formed along the sidewall of the first via hole (VH1) so that the metal layer 226 is connected with the second contact portion 271a formed on the other surface of the flexible polymer film 210. In addition, the metal layer 226 extends at least to the adhesive layer 250 by passing through the second contact portion 271a and the first insulating layer 240.

In this case, the adhesive layer 250 may include a conductive material. The adhesive layer 250 including the conductive material enables to prevent electromagnetic interference (EMI) by the structure of the above ground pad 222.

Figure 8:
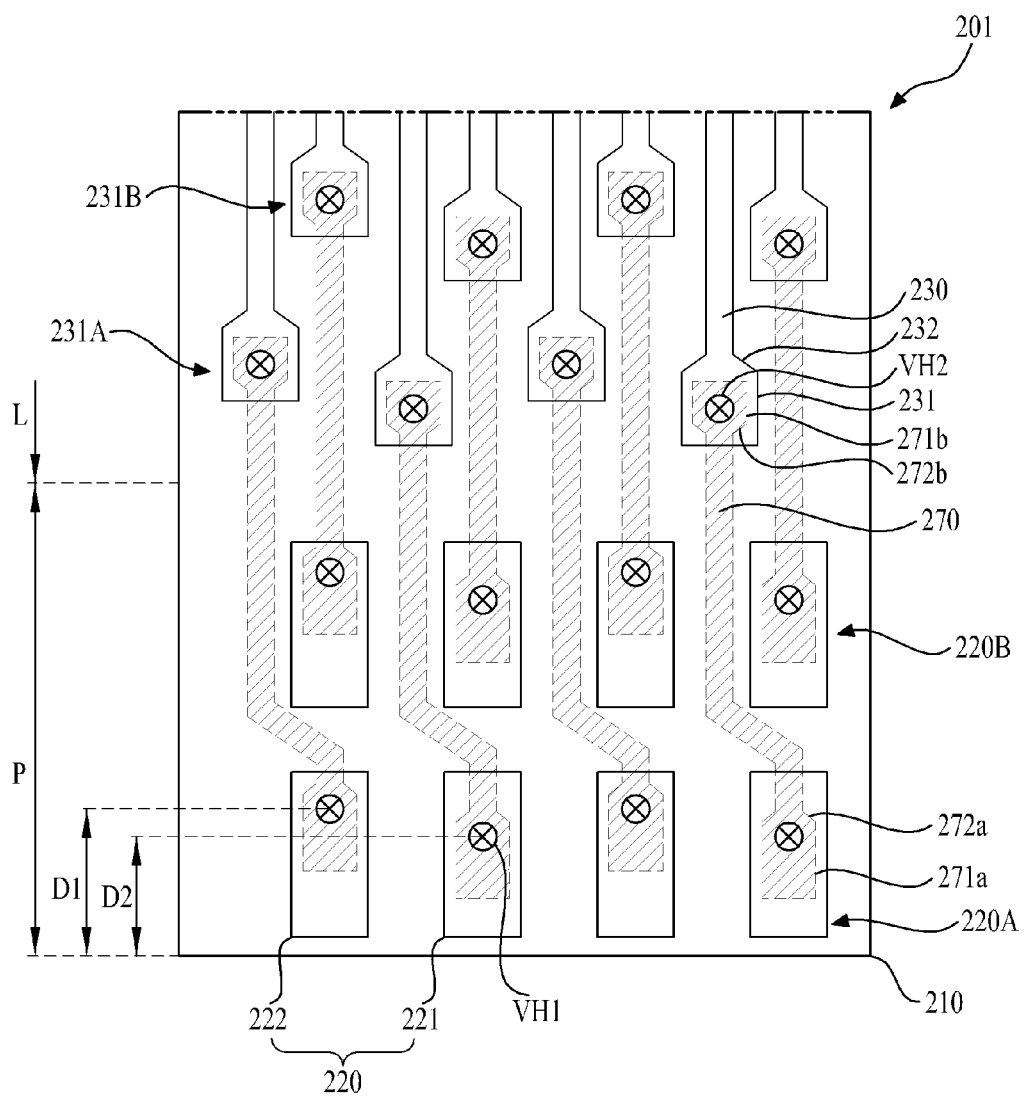
FIG. 8 is a plane view illustrating a connector provided in an FPC film according to another embodiment of the present invention.

FIG. 8 is a plane view illustrating a connector of an FPC film according to another embodiment of the present invention, which corresponds to a modified embodiment obtained by changing arrangements of plural pads 220 and plural connection lines 270 of the connector shown in FIGS. 7A to 7D.

As shown in FIG. 8, a plurality of pads 220, provided on one surface of a flexible polymer film 210, may be formed of pad sets of plural rows including a pad set 220A of a first row and a pad set 220B of a second row.

The pads 220 for the pad set 220A of the first row and the pad set 220B of the second row are provided in an in-line structure instead of the zigzag structure shown in FIG. 7A. That is, the pads 220 for the pad set 220A of the first row confront the pads 220 for the pad set 220B of the second row. Thus, the number of pads 220 for the pad set 220A of the first row is the same as the number of pads 220 for the pad set 220B of the second row.

The plurality of connection lines 270 are formed on the other surface of the flexible polymer film 210. Each of the plural connection lines 270 is connected with a second bottleneck portion 272a, a second contact portion 271a, a third bottleneck portion 272b and a third contact portion 271a. In this case, the connection line 270, the second bottleneck portion 272a, the second contact portion 271a, the third bottleneck portion 272b, and the third contact portion 271a connected with one another may be arranged in an in-line shape or a bent-line shape.

As described above, if the combination of the connection line 270, the second bottleneck portion 272a, the second contact portion 271a, the third bottleneck portion 272b, and the third contact portion 271a, which are electrically connected with the pads 220 for the pad set 220B of the second row, is arranged in the in-line shape; the combination of the connection line 270, the second bottleneck portion 272a, the second contact portion 271a, the third bottleneck portion 272b and the third contact portion 271a, which are electrically connected with the pads 220 for the pad set 220A of the first row, is arranged in the bent-line shape. On the contrary, if the combination of the connection line 270, the second bottleneck portion 272a, the second contact portion 271a, the third bottleneck portion 272b and the third contact portion 271a, which are electrically connected with the pads 220 for the pad set 220B of the second row, is arranged in the bent-line shape; the combination of the connection line 270, the second bottleneck portion 272a, the second contact portion 271a, the third bottleneck portion 272b and the third contact portion 271a, which are electrically connected with the pads 220 for the pad set 220A of the first row, is arranged in the in-line shape.

In the drawings, the combination of the connection line 270, the second bottleneck portion 272a, the second contact portion 271a, the third bottleneck portion 272b and the third contact portion 271a, which are electrically connected with the pads 220 for the pad set 220B of the second row, is arranged in the in-line shape; and the combination of the connection line 270, the second bottleneck portion 272a, the second contact portion 271a, the third bottleneck portion 272b and the third contact portion 271a, which are electrically connected with the pads 220 for the pad set 220A of the first row, is arranged in the bent-line shape, but it is not limited to this structure.

Figure 9:
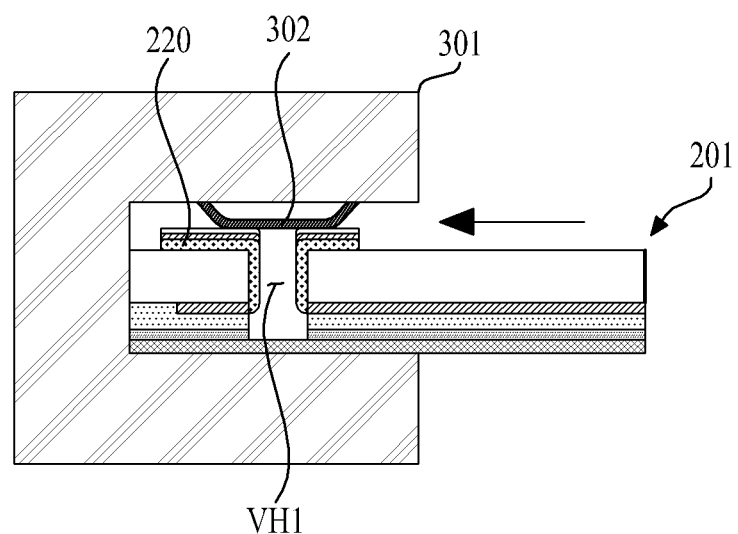
FIG. 9 illustrates an electrical connection between a connector of an FPC film and a mating connector of a PCB in the LCD device according to one embodiment of the present invention.

FIG. 9 illustrates the electrical connection between the connector of the FPC film and the mating connector of the PCB.

The mating connector 301 of the PCB 300 is provided with a predetermined space into which the connector 201 of the FPC film 200 is inserted, wherein the predetermined space of the mating connector 301 is provided with a pin 302.

Thus, if the connector 201 of the FPC film 200 is inserted into the predetermined space of the mating connector 301 of the PCB 300, the pin 302 is brought into contact with the pad 220 provided in the connector 201 of the FPC film 200. In this case, the pin 302 is overlapped with the first via hole (VH1) inside the pad 220, whereby it is possible to shorten a transfer path of the control signal.

The above description of the present invention is applied to the LCD device, one of various display devices, but not limited to the LCD device. For example, the various display devices such as an organic light emitting device (OLED) may be applied.

According to the present invention, the plurality of pads 220 are formed by combining the pad sets of plural rows including the pad set 220A of the first row and the pad set 220B of the second row, and the respective pads 220 are electrically connected with the lines 230 through the first via hole (VH1). Thus, even though the connector 201 of the FPC film 200 is bent, it is possible to prevent crack occurrence in the bent region of the connector 201 of the FPC film 200.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A flexible printed circuit film (FPC film) comprising:
    a body extending along a side of a substrate; and
    a connector protruding from the body, the connector detachably combined with a printed circuit board (PCB),
    wherein the connector comprises:
    a flexible polymer film including a pad region and a line region, wherein a plurality of first via holes are formed in the pad region;
    a plurality of pads overlapped with the first via hole in the pad region on one surface of the flexible polymer film; and
    a plurality of lines electrically connected with the plurality of pads through the first via hole,
    wherein the plurality of pads are formed of pad sets of plural rows including a pad set of a first row and a pad set of a second row.

2. The FPC film according to claim 1,
    wherein the plurality of lines extend from the line region to the pad region on the other surface of the flexible polymer film,
    a first contact portion whose width is larger than that of the line is formed at an end in each of the plural lines, and
    the first contact portion overlapped with the first via hole is connected with the pad.

3. The FPC film according to claim 2,
    wherein a first insulating layer is formed on the plurality of lines and the first contact portion provided on the other surface of the flexible polymer film,
    an adhesive layer is formed on the first insulating layer, and a reinforcement layer is formed on the adhesive layer.

4. The FPC film according to claim 1,
    wherein the plurality of lines are formed in the line region on one surface of the flexible polymer film, and
    a plurality of connection line, which are electrically connected with the plurality of pads and the plurality of lines, are additionally formed on the other surface of the flexible polymer film.

5. The FPC film according to claim 4,
    wherein a first contact portion whose width is larger than that of the line is formed at an end in each of the plural lines; and
    a second contact portion whose width is larger than that of the connection line is formed at an end in each of the plural connection lines, and a third contact portion whose width is larger than that of the connection line is formed at the other end in each of the plural connection lines,
    wherein the second contact portion overlapped with the first via hole is connected with the pad, and the third contact portion overlapped with a second via hole in the flexible polymer film is connected with the first contact portion.

6. The FPC film according to claim 5,
    wherein a first insulating layer is formed on the plurality of connection lines, the second contact portion and the third contact portion provided on the other surface of the flexible polymer film, an adhesive layer is formed on the first insulating layer, and a reinforcement layer is formed on the adhesive layer; and
    a second insulating layer is formed on the plurality of lines and the first contact portion provided on one surface of the flexible polymer film.

7. The FPC film according to claim 1,
    wherein the plurality of pads include a signal pad and a ground pad; and
    an adhesive layer including a conductive material is formed on the other surface of the flexible polymer film,
    wherein the signal pad extends to the other surface of the flexible polymer film along a sidewall of the first via hole without being in contact with the adhesive layer, and the ground pad extends to the other surface of the flexible polymer film along a sidewall of the first via hole while being in contact with the adhesive layer.

8. The FPC film according to claim 1, wherein a first contact portion whose width is larger than that of the line is formed at an end in each of the plural lines, and a first bottle-neck portion whose width is gradually decreased is formed between the line and the first contact portion.

9. The FPC film according to claim 1, wherein the plurality of first via holes include at least two of first via holes provided at different positions inside the pad set of the first row, and at least two of first via holes provided at different positions inside the pad set of the second row.

10. The FPC film according to claim 1, wherein each of the plural pads includes a metal layer extending from one surface of the flexible polymer film to the other surface of the flexible polymer film along the sidewall of the first via hole, an anticorrosive layer formed on the metal layer, and an interfacial layer formed between the metal layer and the anticorrosive layer.

11. The FPC film according to claim 1, wherein the pads for the pad set of the first row and the pads for the pad set of the second row are arranged in a zigzag pattern or in-line pattern.

12. A display device comprising:
    a substrate on which gate and data lines are formed;
    a printed circuit board (PCB) on which a predetermined device is mounted; and
    a flexible printed circuit (FPC) film including a body extending along a side of a substrate, and a connector protruding from the body, wherein the connector is detachably combined with the PCB;

wherein the connector comprises:
a flexible polymer film including a pad region and a line region, wherein a plurality of first via holes are formed in the pad region;
a plurality of pads overlapped with the first via hole in the pad region on one surface of the flexible polymer film; and
a plurality of lines electrically connected with the plurality of pads through the first via hole,
wherein the plurality of pads are formed of pad sets of plural rows including a pad set of a first row and a pad set of a second row.

13. The display device according to claim 12, wherein the PCB includes a mating connector to be combined with the connector of the FPC film, wherein the mating connector is provided with a plurality of pins inside a predetermined space to receive the FPC film therein, and the plurality of pins are overlapped with the first via hole.

* * * * *